(12) United States Patent
Min et al.

(10) Patent No.: US 7,486,545 B2
(45) Date of Patent: *Feb. 3, 2009

(54) THERMALLY ASSISTED INTEGRATED MRAM DESIGN AND PROCESS FOR ITS MANUFACTURE

(75) Inventors: Tai Min, San Jose, CA (US); Po-Kang Wang, San Jose, CA (US)

(73) Assignee: Magic Technologies, Inc., Milpitas, CA (US)

( * ) Notice: Subject to any disclaimer, the term of this patent is extended or adjusted under 35 U.S.C. 154(b) by 204 days.

This patent is subject to a terminal disclaimer.

(21) Appl. No.: 11/264,587

(22) Filed: Nov. 1, 2005

(65) Prior Publication Data

US 2007/0097734 A1     May 3, 2007

(51) Int. Cl.
     *G11C 11/00* (2006.01)
(52) U.S. Cl. ................... 365/158; 365/171; 365/173
(58) Field of Classification Search ............... 365/158, 365/171, 173
See application file for complete search history.

(56) References Cited

U.S. PATENT DOCUMENTS

| | | | |
|---|---|---|---|
| 6,166,948 A | 12/2000 | Parkin et al. | 365/173 |
| 6,385,082 B1 | 5/2002 | Abraham et al. | 365/171 |
| 6,603,678 B2 | 8/2003 | Nickel et al. | 365/171 |
| 6,724,674 B2 | 4/2004 | Abraham et al. | 365/211 |
| 6,771,534 B2 | 8/2004 | Stipe | 365/158 |
| 6,819,586 B1 | 11/2004 | Anthony et al. | 365/171 |
| 6,819,587 B1 | 11/2004 | Sharma | 365/173 |
| 6,865,105 B1 | 3/2005 | Tran | 365/158 |
| 6,950,335 B2 * | 9/2005 | Dieny et al. | 365/171 |
| 6,958,927 B1 * | 10/2005 | Nguyen et al. | 365/158 |
| 7,345,911 B2 * | 3/2008 | Min et al. | 365/158 |
| 2004/0130936 A1 | 7/2004 | Nguyen et al. | 365/158 |

OTHER PUBLICATIONS

Co-pending U.S. Appl. No. 11/331,998, filed Jan. 13, 2006, "MRAM with Split Read-Write Cell Structures", assigned to the same assignee.

"Thermally Assisted Switching in Exchange-Biased Storage Layer Magnetic Tunnel Junctions", by Prejbeanu et al., IEEE Trans. on Magnetics, vol. 40, No. 4, Jul. 2004, pp. 2625-2627.

* cited by examiner

*Primary Examiner*—Anh Phung
*Assistant Examiner*—Hien N Nguyen
(74) *Attorney, Agent, or Firm*—Saile Ackerman LLC; Stephen B. Ackerman

(57) ABSTRACT

A memory element uses a conventional MTJ for reading purposes and a separate magnetic reference stack which is briefly heated while information is written into it. This information is then magnetostatically imposed on the MTJ's free layer which is located nearby. In this way the MTJ can be optimized for maximum dr/r while the reference stack can be optimized for optimum stability, since there is no half select problem. A process for manufacturing the memory element is also described.

21 Claims, 10 Drawing Sheets

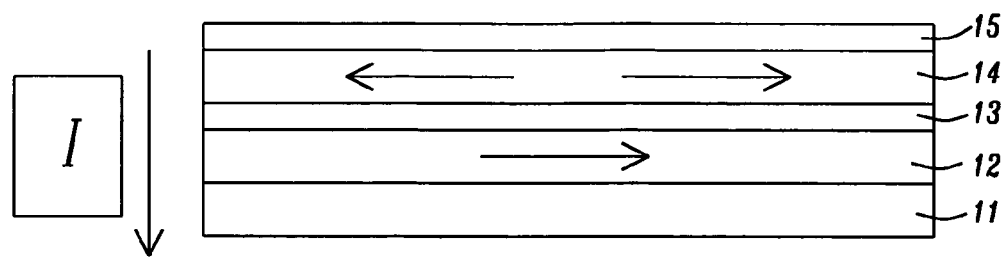
FIG. 1 – Prior Art
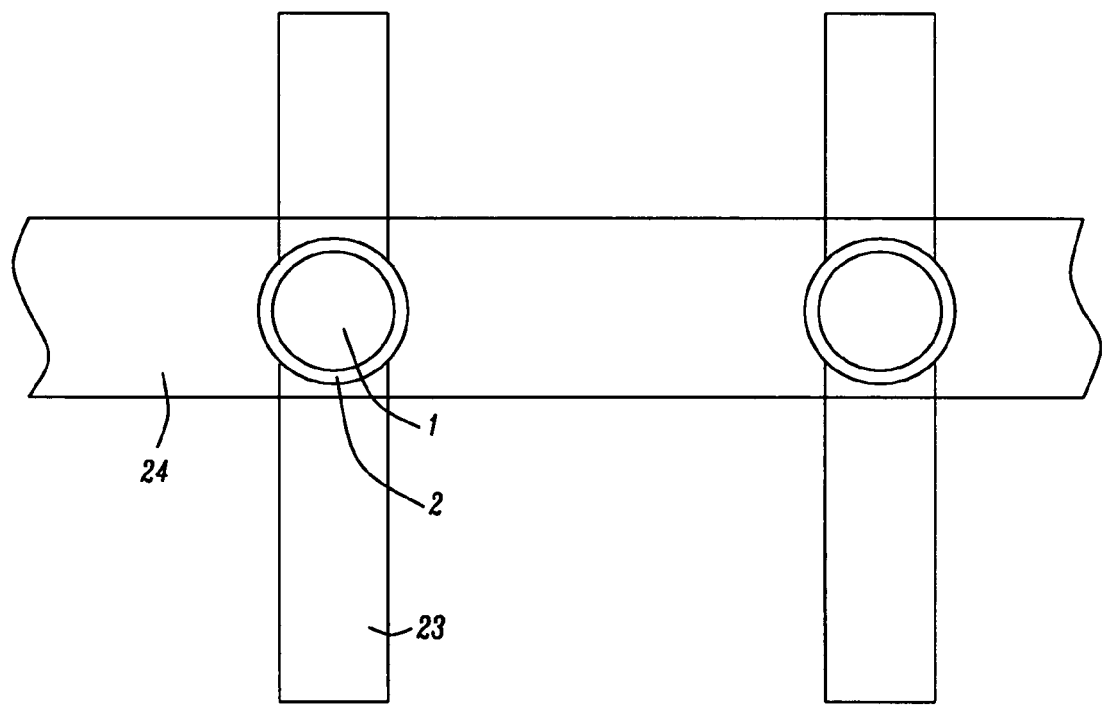
FIG. 2a

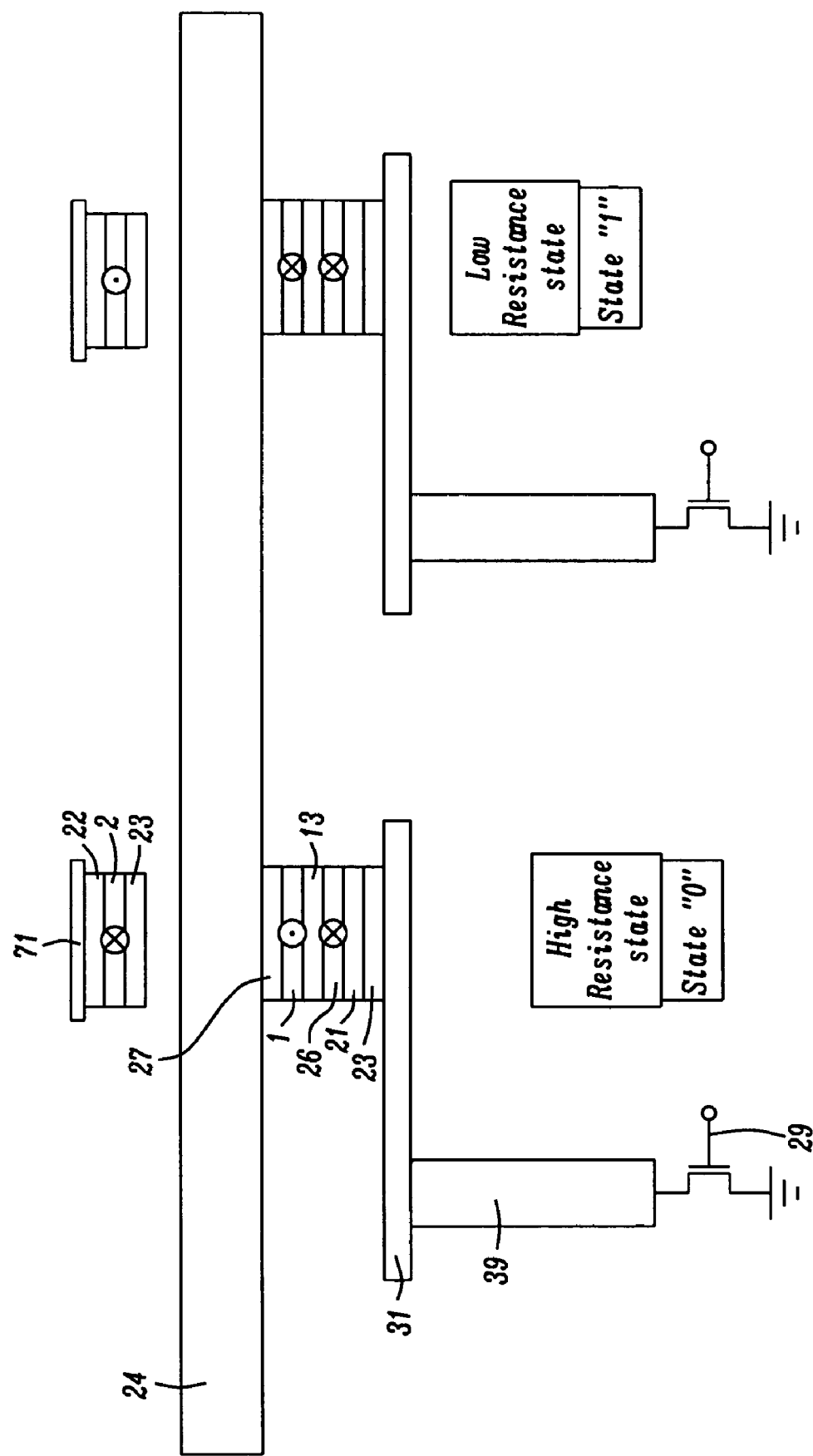

THERMALLY ASSISTED INTEGRATED MRAM DESIGN AND PROCESS FOR ITS MANUFACTURE

Related application (Ser. No. 11/331,998 filed on Jan. 13, 2006) discloses a split read-write cell structure without thermally assisted writing. It is herein incorporated, by reference, in its entirety.

FIELD OF THE INVENTION

The invention relates to the general field of magnetic storage with particular reference to very dense arrays of magnetic tunnel junctions.

BACKGROUND OF THE INVENTION

Magnetic tunneling junctions (MTJ) with two ferromagnetic layers separated by a tunneling oxide layer have been widely studied for use as a random-access memory element. Usually one of the ferromagnetic layers is in a fixed direction (the pinned layer), while the other layer is free to switch its magnetization direction, and is usually called the free layer.

For magnetic random access memory (MRAM) applications, the MTJ is usually formed so that it exhibits an anisotropy, such as shape anisotropy. In its quiescent state, the free layer magnetization lies along the orientation of the pinned layer, either parallel or anti-parallel to that layer's magnetization. During the read operation a small current is sent through the MTJ junction to sense its resistance which is low for parallel magnetization and high for anti-parallel magnetization. The write operation provides Hs, the magnetic field (via bit/word lines) that is needed to switch between the two states, its magnitude being determined by the anisotropy energy of the element.

The free layer is used during both read and write operations. The cell to be programmed lies at the intersection of a bit and a word line so the fields associated with these bit/word lines can inadvertently affect other cells that lie under them, creating the so-called half-select problem which may cause unintended half selected cells to be accidentally switched.

Another challenge facing this design is that it is very difficult to scale down to smaller dimension since the switching field from the shape anisotropy is inversely proportional to its dimensions (Hs≅MsT/w where w is the smallest dimension of the cell) while the field generated by the current is roughly I/w. The current I provided by its transistor will scale down as w scales down, for future technologies, leaving H roughly constant. Thus for future smaller cells, more current will be needed.

This conventional MRAM design has several shortcomings:
a) Coupling between the free layer and the pin layer, due to the roughness of the oxide layer, is often called the orange peel effect. This coupling induces a bias in the switching threshold of the free layer magnetization. The variation of this coupling thus causes variations in the switching threshold during write operation.
b) The magnetic charges at the edges of the pinned layer also produce a bias. Again, variations of this bias induce variations in the switching threshold.
c) For reliable switching behavior, the ferromagnetic free layer is generally limited to materials with small coercivity. This makes it difficult to use certain materials that have a large magneto-resistive (MR) ratio (Dr/r). For example, CoFeB and CoFe with high Fe concentration have good MR ratios, but are generally poor for magnetic softness.
d) The half select problem discussed above.
e) The scaling down difficulties discussed above.

An alternative design, called thermal assisted switching (TAS-MRAM), that addresses the half-select and scale-down issues, is illustrated in FIG. 1. In this schematic version, two AFM layers 11 and 15 are seen to be exchange coupled to reference layer 12 and free layer 14, respectively. Separating layers 12 and 14 is dielectric tunneling layer 13. Here, the MRAM is not using shape anisotropy to maintain its stored information. Instead, a second antiferromagnetic layer (AFM), that has a low blocking temperature, is added to exchange bias the free layer.

The free layer magnetization is now determined by this second AFM whose direction is determined by sending a heating current through the cell to heat the cell above the second AFM blocking temperature while not exceeding the first AFM Block temperature. The field generated by the bit line current provides the aligning field for the second AFM during cooling thereby setting the free layer magnetization parallel or anti-parallel to that of the pinned layer.

A transistor is needed for each cell to provide the heating current which eliminates the half select problem since only the selected cell is heated while all the other cells under bit line will have the exchange bias from its second AFM layer unchanged. Also, since the temperature rise due to joule heating is roughly: $\Delta T \cong \rho (I/w)^2/c_P \, \delta^2$, where $\rho$ is the effective resistivity of the MTJ stack, $c_P$ is the specific heat capacity of the MRAM cell, and $\delta$ is the effective thickness of the MTJ stack. So the temperature rise from the heat current is constant as the dimension scales down. The exchange field on the free layer from AFM2 is also constant if the film thicknesses of the free layer and AFM are not changed.

This TAS-MRAM design has several shortcomings: It does not solve problems a, b, and c, listed above. Additionally,
d) The heating current passes through the MTJ, so the temperature cannot be raised too high without upsetting the first AFM (used for the reference layer).
e) The MTJ has high resistance which means that the heating current will cause a large voltage across the MTJ, that is likely to break down the tunneling layer (which typically operates below 2 volts, depending on tunneling layer thickness. As density increases, the MTJ resistance needs to be reduced which can only be achieved by an even thinner tunneling layer which means an even lower break-down voltage.
f) The transistor that provides the heating current may be quite large, making the TAS-MRAM cell very big—not a desirable feature for a high density MRAM design.
g) The heating current will generate a circumferential field causing the free layer to be in a vortex state. A very large bit line current is needed to remove this vortex.

All of the shortcomings listed above for both designs are solved by the present invention, while maintaining the advantages of TAS-MRAM, as we will disclose in detail below.

A routine search of the prior art was performed with the following references of interest being found:

Prejbeanu, et.al.; IEEE Trans. Magn. 40(4), 2625, 2004

U.S. Pat. No. 6,166,948 "Thermally Assisted Switching in Exchange-Biased Storage Layer Magnetic Tunnel Junctions". U.S. Pat. No. 6,865,105 (Tran) describes separate writing loop conductors close to each MTJ cell. U.S. Pat. No. 6,819,587 (Sharma) shows a nano-tip movable probe for thermally assisted data storage.

U.S. Pat. No. 6,819,586 (Anthony et al) discloses a thermally assisted magnetic storage element including a write conductor and heating system. U.S. Pat. No. 6,771,534

(Stipe) describes current induced heating of an oxide layer near a free electrode to be switched.

U.S. Pat. No. 6,724,674 (Abraham et al) describes a heating element separate from the storage cell. U.S. Pat. No. 6,385,082 (Abraham et al) teaches that each storage cell comprises at least one reversible magnetization region or layer, but no description is given of more than one free layer. U.S. Pat. No. 6,603,678 (Nickel et al) shows heat applied to the free layer. U.S. Patent Application 200410130936 (Nguyen et al) discloses two resettable magnetization layers having different shapes.

SUMMARY OF THE INVENTION

It has been an object of at least one embodiment of the present invention to provide a magnetic random access memory element having reduced variation in its switching threshold during write operations Another object of at least one embodiment of the present invention has been to provide a memory element whose component parts may be independently optimized with respect to shape, materials, thickness, etc.

Still another object of at least one embodiment of the present invention has been that said memory element not be subject to half select problems.

A further object of at least one embodiment of the present invention has been that said memory element not require the application of voltages across a tunneling barrier layer that are potentially high enough to damage such a tunneling layer.

A still further object of at least one embodiment of the present invention has been that it be containable within a small unit cell.

Yet another object of at least one embodiment of the present invention has been to provide a method for achieving these goals and a process for manufacturing said memory element.

These objects have been achieved by splitting the free layer of an MTJ MRAM into two separate parts—a read-sensing free layer within an MTJ stack having little or no anisotropy, and an information storage free layer with some anisotropy to provide a field to align the read-sensing free layer. The information storage layer is programmed by thermal assisted writing. This eliminates the half select problem as well as the switching current scaling down problem.

The main components are a conventional MTJ stack, a magnetic reference stack, a heating line for the latter's AFM layer, bit and word lines, and isolation transistors to direct the reading and writing functions. There are many different ways in which these components can be arranged. Several examples of such possible arrangements are presented as embodiments of the invention, it being understood that other arrangements, based on the general spirit of the invention, remain possible.

BRIEF DESCRIPTION OF THE DRAWINGS

FIG. 1 illustrates a prior art memory element.

FIGS. 2a and 2b show a first embodiment of the invention featuring an MTJ stack directly above a magnetic reference stack. Heating of the reference stack is achieved by passing current through it from a heating line into the word line.

FIG. 8 shows a ninth embodiment that is similar to the sixth embodiment except that the reference stack lies above the bit line.

DESCRIPTION OF THE PREFERRED EMBODIMENTS

A key feature of the present invention, TAISL-MRAM (Thermal-Assisted-Integrated-Storage-Layer MRAM) is the separation of the free layer into two parts: read-sensing and information storage.

Free layer 1 is for the read operation, being part of the MTJ structure but having little or no anisotropy (e.g. having a circular shape) so its magnetization will align with any external magnetic field. Free layer 2 is for the write operation. It stores the desired digital information, the magnetic field from its edge poles serving to align the magnetization of free layer 1.

The free layer 2 structure is a simple ferromagnetic layer exchange coupled to low blocking temperature AFM layer 2 which maintains its magnetization in the desired direction corresponding to a "1" or "0". The structure of free layer 2 need not be an MTJ stack. During a write operation, a heating current pulse is passed through free layer 2, elevating its temperature above the blocking temperature of AFM layer 2. On cooling, free layer 2 will retain the magnetic orientation induced in it by the bit line, and will continue to do so by virtue of the exchange anisotropy provided by AFM layer 2. The magnetostatic field from the free layer 2 edge poles will align free layer 1 along the magnetization direction of the pinned reference layer (but opposite to the direction of free layer 2).

Both free layers can have a circular shape. A preferred embodiment has the exchanging biasing direction of free layer 2 along that of the pinned layer of the sensing MTJ element so as to achieve maximum total resistance change. During a read operation, the read current passes through the MTJ stack only with free layer 1 to sense the high (low) resistance depending on relative directions of free layer 1 and the pinned reference layer.

Free layer 1 can have some shape anisotropy (such as in a low aspect ratio ellipse) to help maintain its magnetization in the desired direction but this anisotropy needs to be small enough so its magnetization is determined by the magnetization direction of free layer 2.

Free layer 1 can also be super-paramagnetic layer (thickness below a critical value) so, while it has a dr/r value, it has no measurable moment at room temperature since it retains little or no residual magnetization in the absence of external field, its magnetization being essentially proportional to the external field in any orientation.

Multiple embodiments of the above TAISL-MRAM design are possible. We will describe some of these below, as examples, but it will be understood that various other arrangements and combinations of the basic elements that comprise the present invention are possible without departing from the spirit of the invention.

1st Embodiment

Figure 2B:
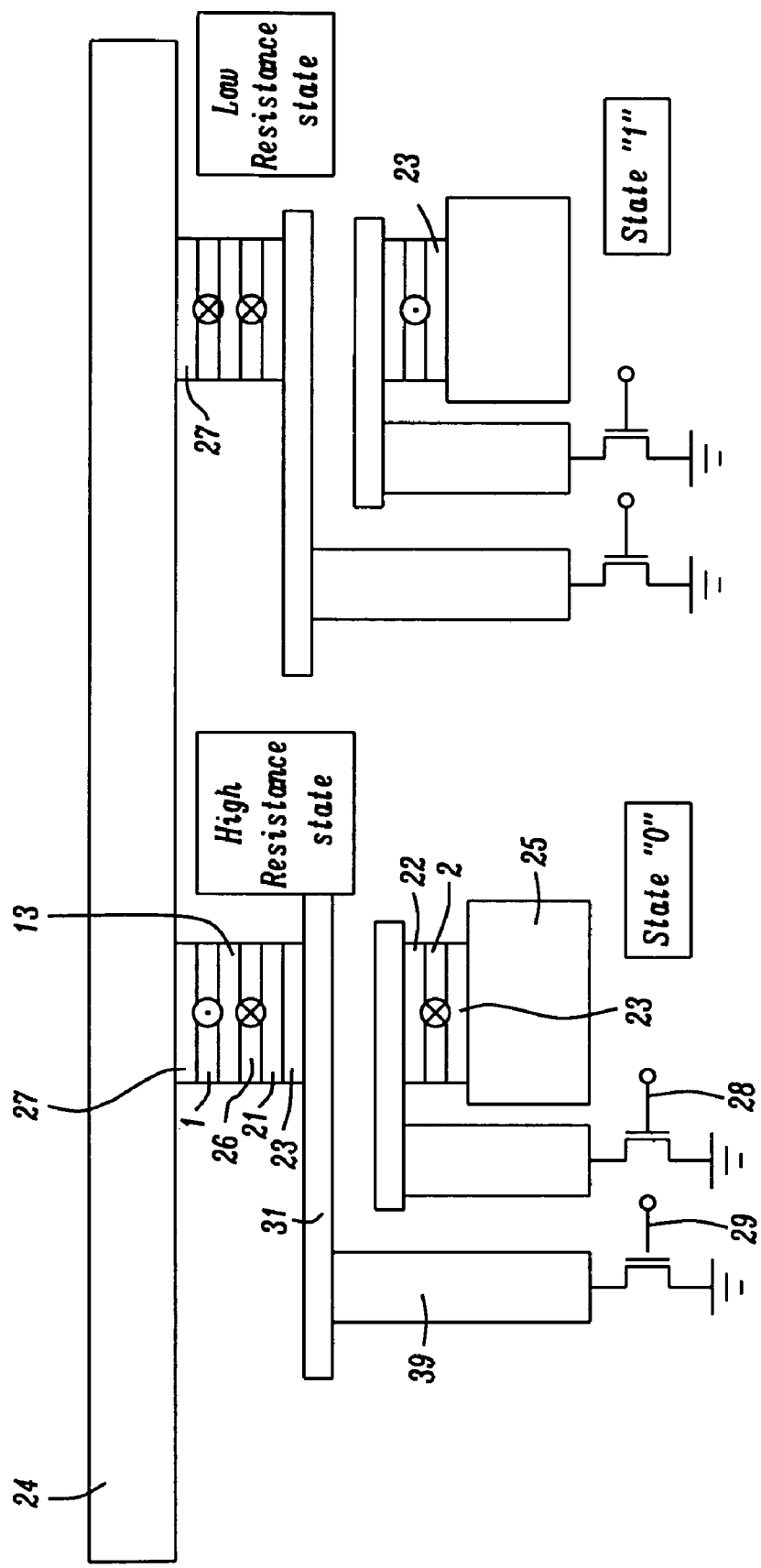

Referring now to FIG. 2a, we show two storage elements, each addressed by its own word line 25 but sharing a common bit line 24. The read sensing element (free layer 1) is seen in FIG. 2a to be a circular MTJ structure. The storage element (free layer 2) has a circular shape with simple ferromagnetic layer with a low-blocking temperature AFM layer (AFM 22) on top/under the free layer 2, as shown in FIGS. 2a and 2b for a HCPP design (heating current perpendicular to plane). Two memory cells are shown, one in each of the two possible states. Transistor 28 is used to provide the heating current for free layer 2 which current is carried by word line 25. Transistor 29, connected to stud 39, serves to control the measurement of the MTJ resistance.

It is a key feature of the invention that, since the read-sensing and information storage functions derive from different layers, each can be optimized independently. The materials chosen for each free layer can be very different. For example, free layer 1 can be optimized for high dr/r by using materials like CoFeB, CoFe or NiFe with high Fe content while the material for free layer 2 can be selected for its switching behavior or for having a high exchange bias field. As a result, the storage element can be a simple ferromagnetic layer plus an AFM layer with low blocking temperature, thereby eliminating undesirable effects on switching behavior from Néel field coupling in the MTJ stack and the residual demagnetization field from the pinned layer edge.

Since there is no MTJ on free layer 2, there is no tunneling layer to be broken down. Also, heating is centered some distance away from AFM layer 21, thereby reducing the chances of disturbing it during a write operation. AFM 22 can be a metal alloy like IrMn, PtMn, OsMn, RhMn, FeMn, CrPtMn, RuMn, ThCo, etc or an oxide like CoO, NiO, CoNiO.

Also seen in FIG. 2b are capping layer 27, seed layer 23, electrode 31, and pinned layer 26.

Figure 3:
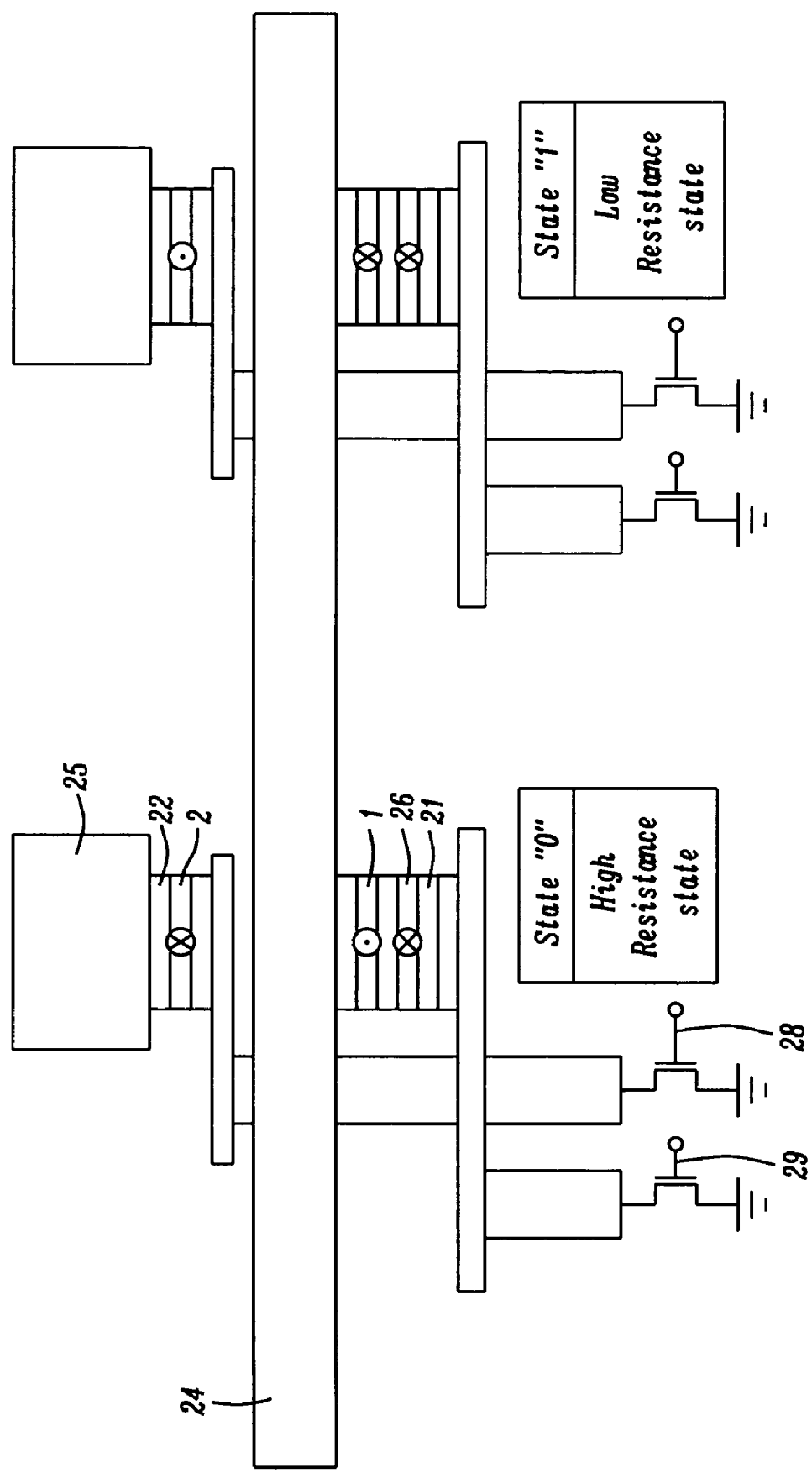
FIG. 3 shows a second embodiment which is similar to the first embodiment except that the reference stack lies above the MTJ.
Figure 4:
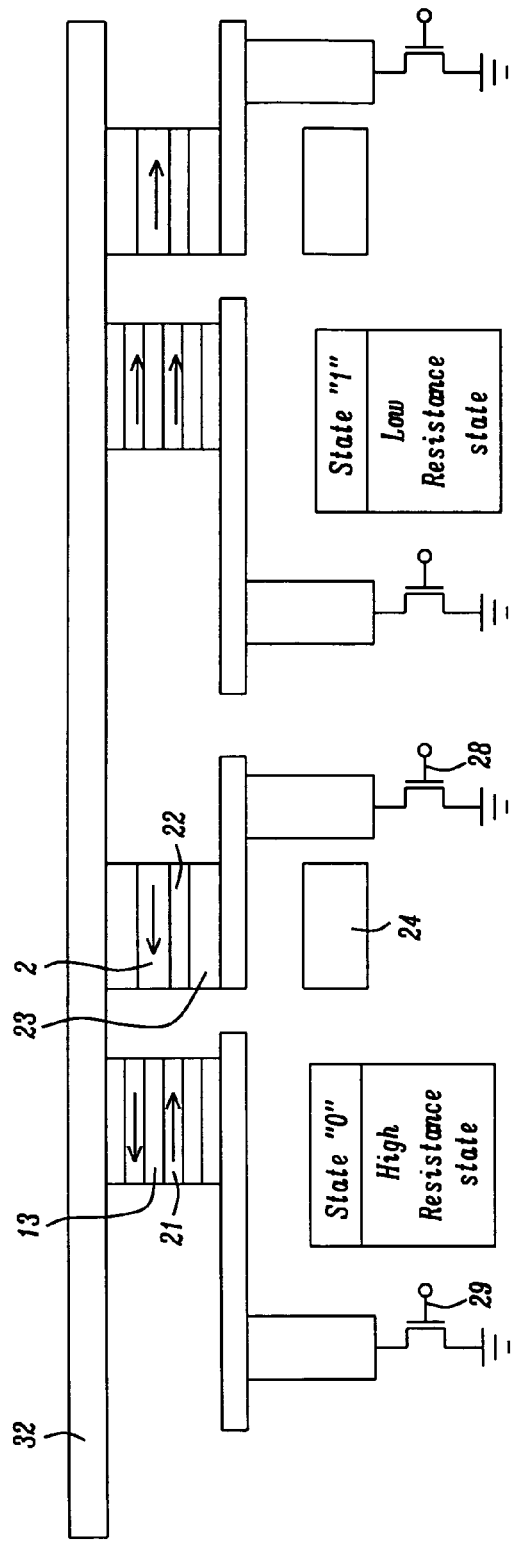
FIG. 4 shows a third embodiment in which the MTJ and reference stacks are side by side, sharing a common top electrode.

Two other possible HCPP embodiments are shown in FIGS. 3 and 4:

2nd Embodiment

This resembles the 1st embodiment except that the relative positions of the two free layers as well as the bit and word lines have been switched. Thus, as seen in FIG. 3, free layer 2 lies directly between bit line 24 and word line 25, thereby reducing the current strength needed for writing, relative to embodiment 1. As in embodiment 1, the heating current is controlled by transistor 28 and is carried by word line 25.

3rd Embodiment

Referring next to FIG. 4, free layers 1 and 2 are disposed to lie side by side with bit line 24 being directly beneath free layer 2. Both free layers share common electrode 32 which carries the heating current. The latter is controlled by transistor 28 so that it passes only through free layer 2 and not through free layer 1. The magnetization direction of free layer 1 continues to be magnetostatically determined by that of free layer 2.

4th Embodiment

Figure 5A:
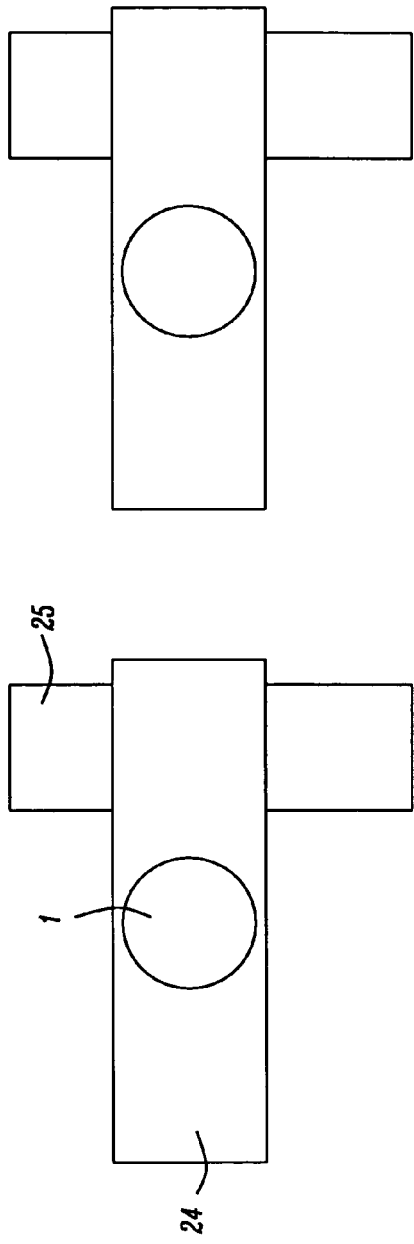
FIGS. 5a and 5b show a fourth embodiment in which the reference stack is heated by opposing contacts butted up against it vertical sidewalls.
Figure 5B:
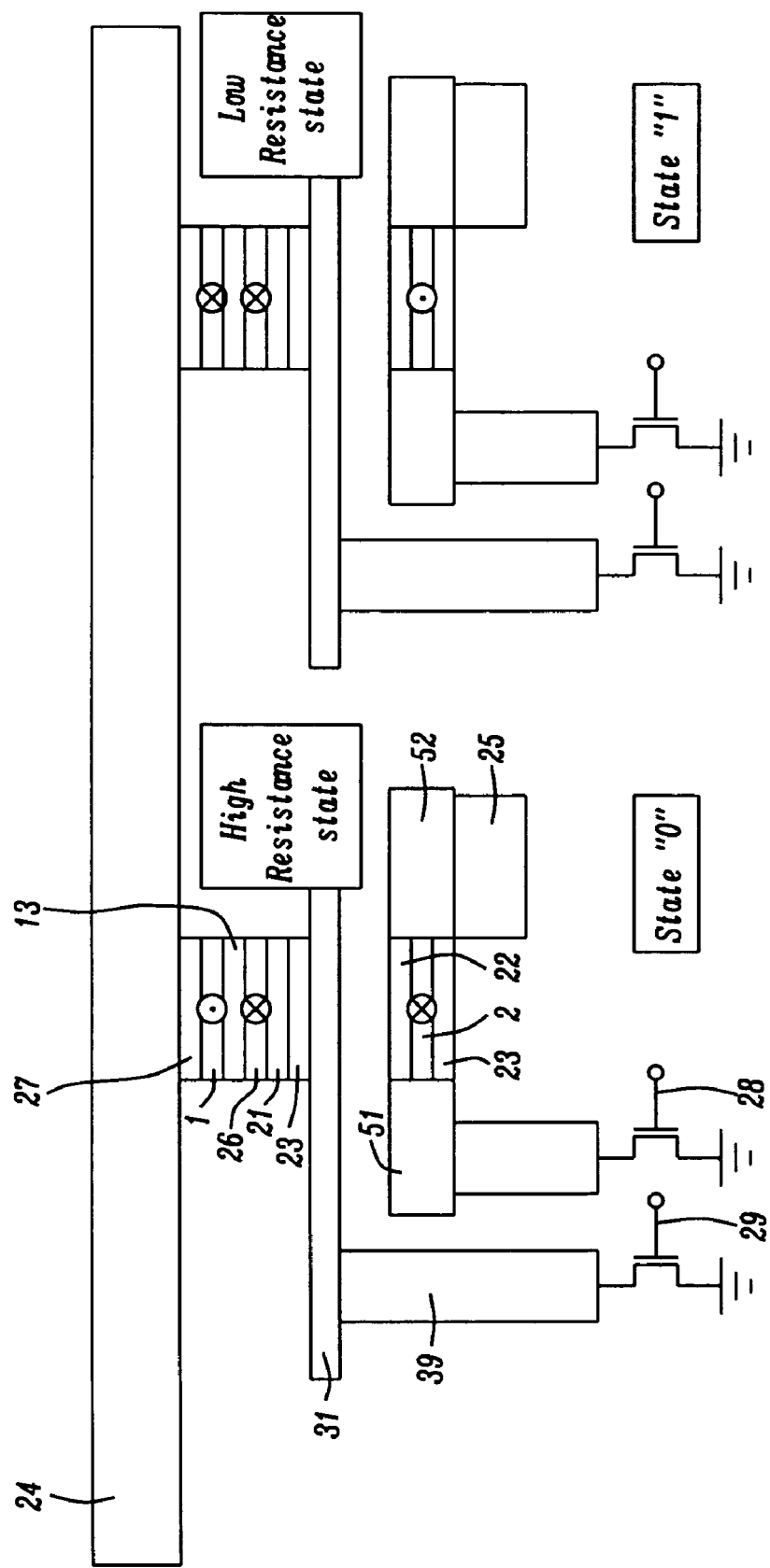

This embodiment is an example of a HCIP (heating current in plane) design. It is illustrated in FIGS. 5a and 5b. Heating of free layer 2 is supplied by butted contact electrodes 51 and 52, controlled by transistor 28 and carried by word line 25. The resistance of the MTJ stack is measured between bit line 24 and stud 39, and is controlled by transistor 29.

5th Embodiment

Figure 6:
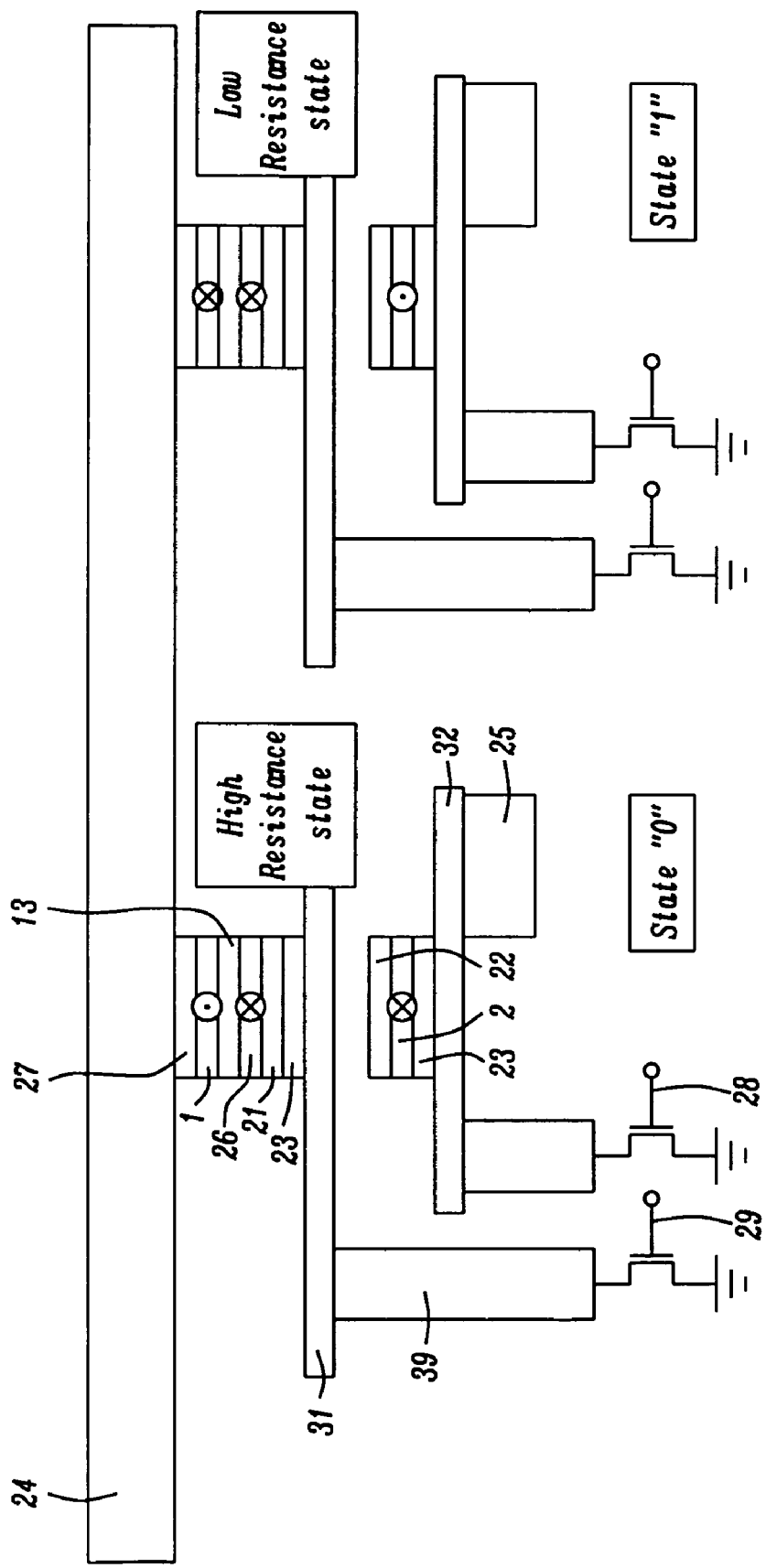
FIG. 6 shows a fifth embodiment that is similar to the fourth embodiment except that the heating line is also the bottom electrode of the reference stack.

This embodiment is another HCIP example. Illustrated in FIG. 6, it resembles the 4th embodiment except that heating of free layer 2 derives from single electrode 32, the heat reaching it by conduction through seed layer 23. The heating current is controlled by transistor 28 and carried by word line 25. The MTJ resistance is measured as in the 4th embodiment.

Embodiments 6 and 7 (not shown here) are similar to embodiment 2 (FIG. 3) except that they are HCIP designs, heating of free layer 2 being achieved as shown in embodiments 5 (FIG. 5b) and 6 (FIG. 6) respectively.

Since the heating transistor can be large if the heating current is high, also the 2T1MTJ (two transistors, one magnetic tunnel junction) configuration makes the cell large, embodiments 8-15 that follow employ a so-called segmented heating line theme to reduce the total cell size by sharing the heating line and the heat controlling transistors.

8th Embodiment

Figure 7A:
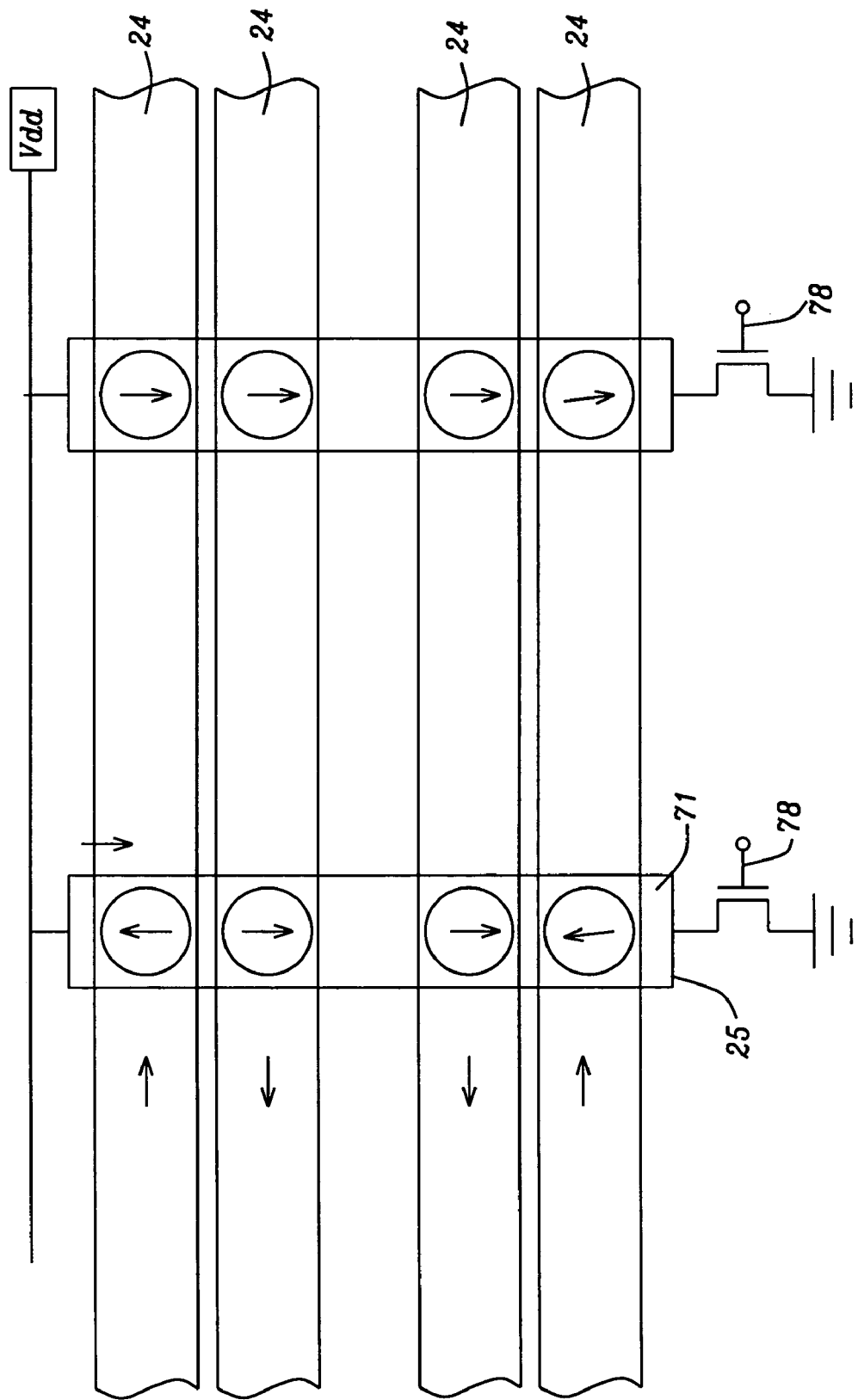
FIGS. 7a and 7b show a eighth embodiment in which the bit lines are segmented into groups, each of which shares a common extended heating line, and both stacks are below the bit line.
Figure 7B:
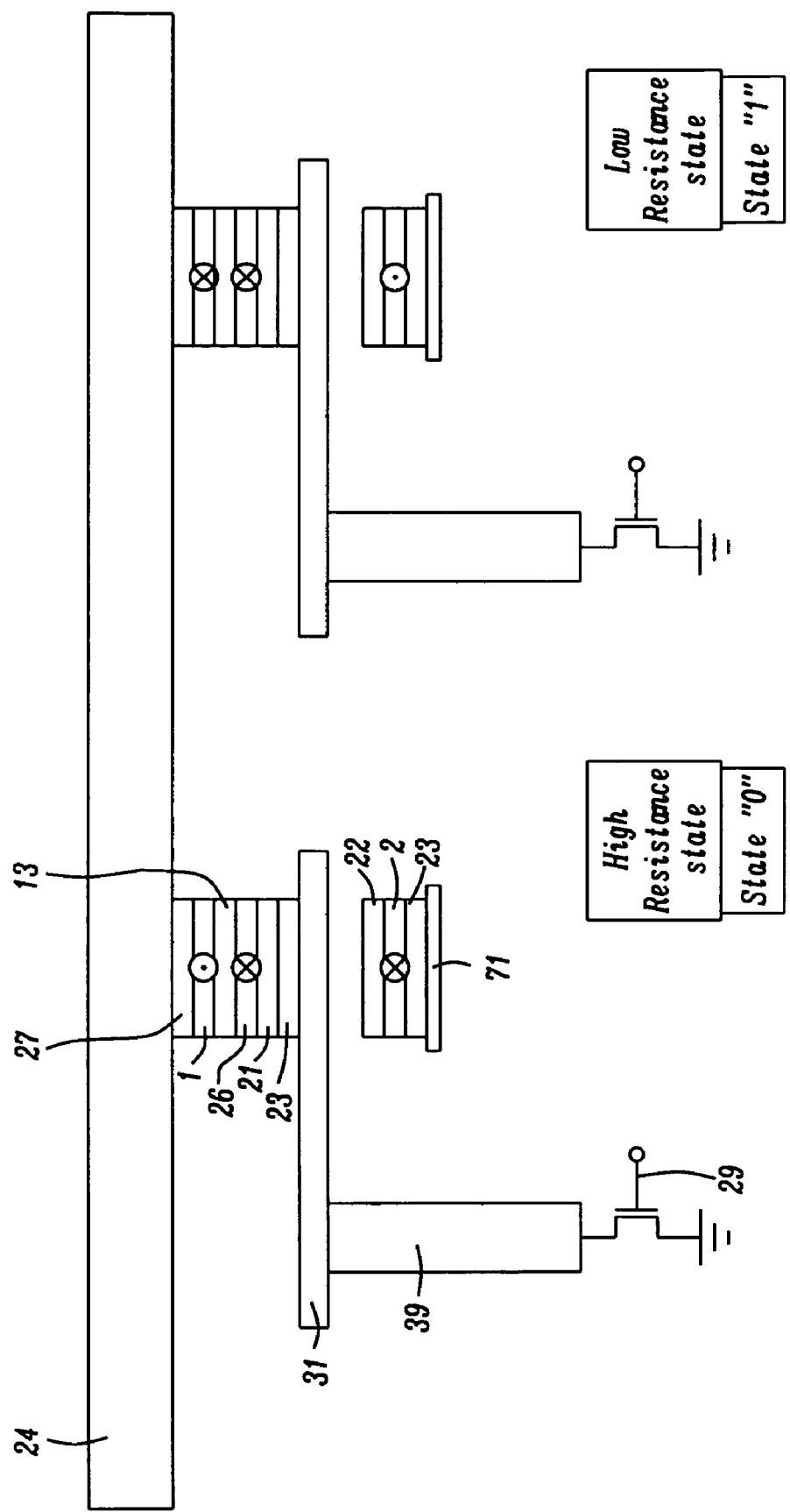

Referring now to FIG. 7a, we show there an assemblage of bit lines all of which are associated with single heating line 71, controlled by a single (shared) transistor 78. As seen in FIG. 7b, all free layers 2 that are in contact with heating line segment 71 get heated simultaneously when transistor 78 turns on but the magnetization of free layer 2 of free layer 2 of heated cells comes under the influence of an external magnetic field (generated by bit line 24) so the memory storage elements are simultaneously set into their desired directions. Thus, heating line 71 only acts as a heating line to erase old information and to allow writing of new data. The resistance of the MTJ stack is read in the normal way through bit line 34 and stud 39, under the control of transistor 29.

9th Embodiment

This is illustrated in FIG. 8. It can be seen to be similar to FIGS. 7a and 7b except that free layer 2 and its associated segmented heating line 71 are located above bit line 24. Since free layer 1 remains below bit line 24, free layer 2 can be located somewhat closer to bit line 24 in a flux-closure arrangement with respect to the bit line field, allowing the bit line current that is required to switch the free layers to be somewhat reduced relative to embodiment 8.

Embodiments 10 and 11

Figure 9A:
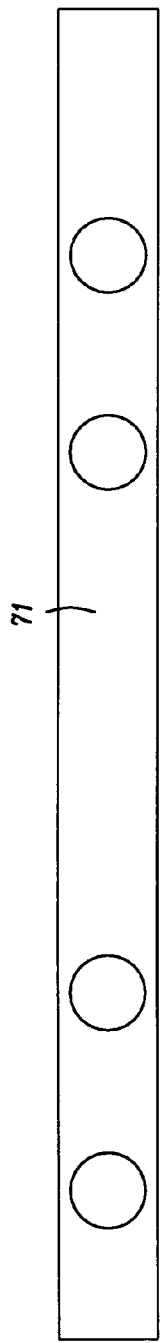
FIGS. 9a and 9b illustrate the principle of using a self-aligned method to prepare a shared heating line.
Figure 9B:
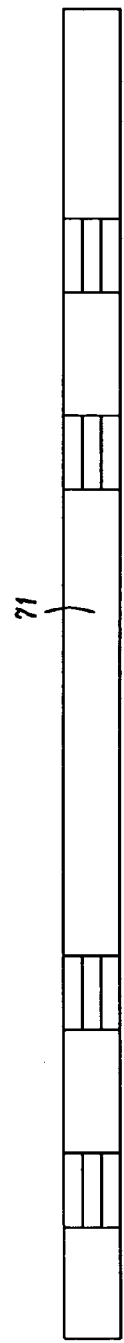

As can be seen in FIGS. 7b and 8, embodiments 8 and 9 depend on thermal conduction to fully heat free layer 2. In the case of embodiment 8 (FIG. 7b), there is the additional presence of seed layer 23 between heating line 71 and free layer 2. In order to achieve more efficient heating of free layer 2, the structures shown in FIGS. 9a and 9b may be used. These are readily formed through a self-aligning process in which a photoresist liftoff method is used to form free layer's 2 stacks. Layer 71 is then deposited on top of free layer 2's stack all surfaces and then lifted off, followed by additional photo processes to define the line as shown in the figure.

Figure 10A:
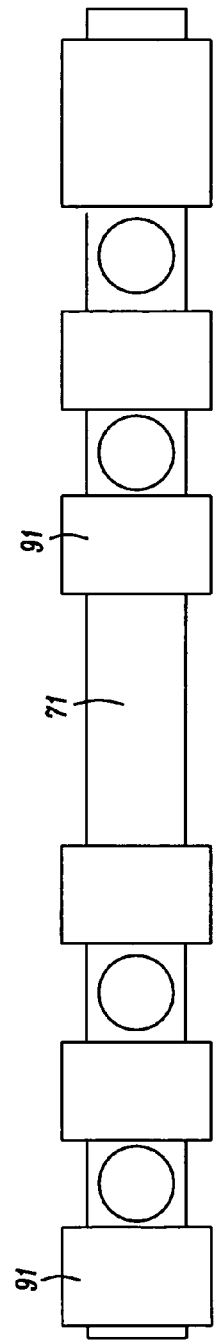
FIGS. 10a and 10b show how to reduce the overall resistance of a shared heating line.
Figure 10B:
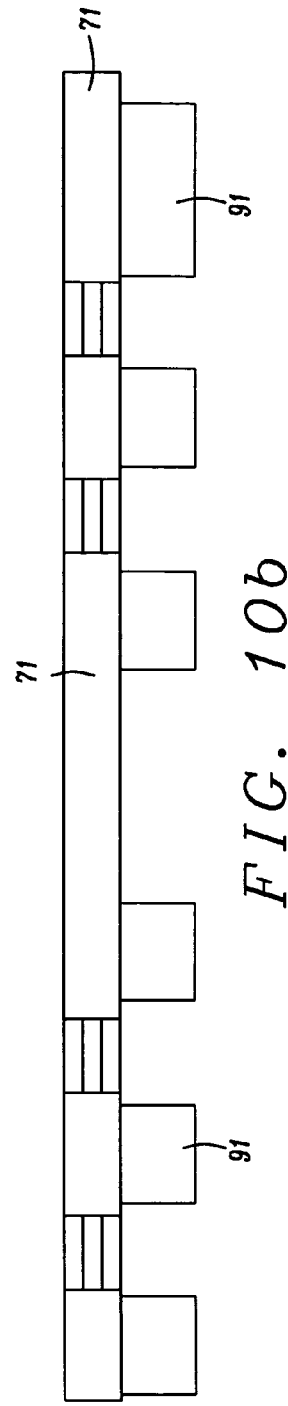

The heating line is usually made of high resistivity material such as Ta, W, alloys, semiconductors like nitrides, doped oxides, or polycrystallines. To enhance the efficiency of the heat line, highly conductive metal blocks 91 (Cu, Au, Al etc.) can be superimposed to contact the heat line wherever there are no MRAM cells. This is illustrated in FIGS. 10*a* and 10*b* (for the self-aligned case). Embodiments 12-15 are thus embodiments 8-11 with this additional feature added as part of their structure.

Additional Refinements:

To minimize the possible influence of stray fields from the pinned layer magnetization on free layer 1, the net pinned layer magnetic moment can be minimized by making it in the form of a synthetic AFM structure wherein the single pinned ferromagnetic layer is replaced by at least two ferromagnetic layers, separated by AFM coupling metals such as Ru and Rh, of precise thickness, such that the two ferromagnetic layers are strongly coupled to each other in an anti-parallel configuration.

It will also be obvious to those skilled in the art that the single storage layer described above in the interests of clarity, can be replaced by a laminate of several layers, such as in a synthetic structure. The same goes for the pinned layer, from which an antiferromagnetic layer to fix the pinned layer has been omitted for brevity.

Free layer 1 can also have the form of a super-paramagnetic layer, whose remnant magnetization is substantially zero with the absence of external field, and whose magnetization is roughly proportional to the external field until reaching a saturation value. This super-paramagnetic free layer can be a free layer consisting of nano-magnetic particles isolated from each other with no exchange coupling between them.

As an example, one can use the same ferromagnetic material as in a conventional MTJ, but at a thickness that is below some critical value. Below this critical thickness the film may become discontinuous, resembling a nano-magnetic layer with isolated magnetic particles. To maintain a high MR ratio, multiple layers of such nano-magnetic layers become advantageous. Additionally, materials that promote grain separation may be added as thin layers between such laminated magnetic layers to further isolate the magnetic nano particles.

What is claimed is:

1. A method to write and store information in a magnetic random access memory (MRAM), comprising:
    providing a magnetic tunnel junction (MTJ) stack, including a first free layer and a first antiferromagnetic (AFM) layer;
    providing a magnetic reference stack, including a second free layer that is exchange coupled to a second AFM layer having a blocking temperature;
    positioning said MTJ and magnetic reference stacks so that said first free layer is magnetostatically coupled to said second free layer;
    positioning said magnetic reference stack so that it is at an intersection of a bit line and a word line;
    while heating said second AFM layer to a temperature above said blocking temperature, passing electric current through said bit line thereby magnetizing said second free layer in a direction; and
    then, while said bit line current is still present, allowing said second AFM layer to cool to a temperature below said blocking temperature whereby said second free layer remains magnetized in said direction.

2. The method of claim 1 wherein both of said free layers have an anisotropy field that is less than about 20 Oe.

3. The method of claim 2 in which each free layer has shape selected from the group consisting of circles, ellipses, rectangles, diamonds, eyes, and Saturns, said shapes having an aspect ratio between about 1 to 3.

4. The method of claim 1 wherein said second AFM layer is selected from the group consisting of IrMn, PtMn, OsMn, NiMn, RhMn, RuMn, FeMn, CrFeMn, TbCo, NiO, CoO, and CoNiO.

5. A magnetic random access memory, comprising: on a first substrate, a first seed layer;
    a first antiferromagnetic (AFM) layer on said first seed layer;
    a pinned layer on said first AFM layer;
    a dielectric tunneling layer on said pinned layer;
    a first free layer on said dielectric tunneling layer, and
    a capping layer on said first free layer thereby defining a magnetic tunnel junction (MTJ) stack;
    on a second substrate, a second seed layer;
    a second free layer on said second seed layer, and
    a second AFM layer on said second free layer, whereby a magnetic reference stack is defined;
    said magnetic reference stack being positioned so that said second free layer is magnetostatically coupled to said first free layer;
    a heating line that is in thermal contact with said reference stack;
    orthogonally disposed bit and word lines that intersect at said magnetic reference stack;
    a first transistor that is connected to said heating line, thereby serving to control current flow through said heating line; and
    a second transistor that is connected to said MTJ stack to enable measurement of said MTJ stack's electrical resistance.

6. The random access memory described in claim 5 wherein both of said free layers have an anisotropy field that is less than about 20 Oe.

7. The random access memory described in claim 5 wherein said second free layer is part of a synthetic AFM structure.

8. The random access memory described in claim 5 wherein said first free layer is a super-paramagnetic layer having a thickness below about 15 Angstroms.

9. The random access memory described in claim 5 wherein said MTJ stack has been independently optimized for maximum dr/r and said reference stack has been independently optimized to have a maximum exchange bias field.

10. The random access memory described in claim 5 wherein:
    said word line is said second substrate;
    said MTJ stack is directly above said magnetic reference stack;
    said heating line is in thermal contact with an upper surface of said second AFM layer;
    said first substrate is a lower electrode of said MTJ stack; and
    said bit line contacts said first capping layer.

11. The random access memory described in claim 5 wherein:
    said magnetic reference stack is directly above said MTJ stack and said second substrate is a bottom electrode of said magnetic reference stack;

said heating line is in thermal contact with a lower surface of said second seed layer;

said first substrate is a lower electrode of said MTJ stack;

said bit line is disposed to lie between said MTJ and magnetic reference stacks and to contact said first capping layer; and said word line is in contact with said second AFM layer.

12. The random access memory described in claim 5 wherein:

said first substrate is a bottom electrode of said MTJ stack;

said second substrate is a bottom electrode of said magnetic reference stack;

said first and second free layers are at the same level;

said bit line is disposed to pass directly beneath said magnetic reference stack; and a common electrode contacts both said MTJ and magnetic reference stacks.

13. The random access memory described in claim 5 wherein:

said MTJ stack lies directly above said magnetic reference layer;

said first substrate is a bottom electrode of said MTJ stack;

said second substrate is a layer of insulation;

said heating line is divided into opposing portions that make butted contact to opposing vertical edges of said magnetic reference stack; and said word line contacts a lower surface of one of said heating line portions.

14. The random access memory described in claim 5 wherein:

said MTJ stack is disposed to lie directly above said magnetic reference layer;

said first substrate is a bottom electrode of said MTJ stack;

said second substrate is a bottom electrode of said magnetic reference stack and is also said heating line; and said word line contacts a lower surface of said heating line.

15. The random access memory described in claim 5 wherein:

said magnetic reference stack is directly above said MTJ stack and said second substrate is a bottom electrode of said magnetic reference stack;

said first substrate is a lower electrode of said MTJ stack;

said bit line lies between said MTJ and magnetic reference stacks and contacts said first capping layer;

said word line is in contact with said second AFM layer; and said heating line is divided into opposing portions that make butted contact to opposing vertical edges of said magnetic reference stack.

16. The random access memory described in claim 5 wherein:

said magnetic reference stack is directly above said MTJ stack and said second substrate is a bottom electrode of said magnetic reference stack;

said first substrate is a lower electrode of said MTJ stack;

said bit line lies between said MTJ and magnetic reference stacks and contacts said first capping layer;

said word line is in contact with said second AFM layer; and said second substrate is a bottom electrode of said magnetic reference stack and is also said heating line.

17. The random access memory described in claim 5 wherein:

said MTJ stack is directly above said magnetic reference stack;

said first substrate is a lower electrode of said MTJ stack;

said second substrate is a lower electrode of said magnetic reference stack as well as being said word line and said heating line;

said heating line has been extended so that it is shared by a number of magnetic reference stacks as well as being connected to said first transistor; and said bit line is one of said number of bit lines, all of which intersect with said shared heating line and contact said first capping layer of each MTJ stack as a group of segmented word lines.

18. The random access memory described in claim 5 wherein:

said magnetic reference stack is directly above said MTJ stack;

said first substrate is a lower electrode of said MTJ stack;

said second substrate is a layer of insulation on said bit line;

said heating line contacts said second AFM layer;

said heating line has been extended so that it is shared by a number of magnetic reference stacks and is connected to said first transistor; and said bit line is one of said number of bit lines, all of which, as a group of segmented word lines, intersect said shared heating line and contact said first capping layer of each MTJ stack.

19. The random access memory described in claim 16 wherein regions of conductive material, selected from the group consisting of Ag, Cu, Au, and Al, are included as part of said extended heating line.

20. The random access memory described in claim 17 wherein regions of conductive material, selected from the group consisting of Ag, Cu, Au, and Al, are included as part of said extended heating line.

21. The random access memory described in claim 5 wherein said first free layer is a laminate of films selected from the group consisting of Go, Fe, Ni, and B and has a thickness between about 5 and 100 Angstroms.

* * * * *

UNITED STATES PATENT AND TRADEMARK OFFICE
CERTIFICATE OF CORRECTION

PATENT NO.         : 7,486,545 B2                                   Page 1 of 1
APPLICATION NO. : 11/264587
DATED              : February 3, 2009
INVENTOR(S)        : Tai Min and Po-Kang Wang It is certified that error appears in the above-identified patent and that said Letters Patent is hereby corrected as shown below:

On the Title Page, in the Assignee Item (73) delete "Magic Technoloies, Inc., Milpitas, CA (US)" and replace with -- MagIC Technologies, Inc., Milpitas, CA (US) --.

Signed and Sealed this

Fifth Day of May, 2009

JOHN DOLL
*Acting Director of the United States Patent and Trademark Office*